United States Patent
Fujikura et al.

(10) Patent No.: US 10,294,566 B2
(45) Date of Patent: May 21, 2019

(54) SUBSTRATE PROCESSING APPARATUS AND SUBSTRATE PROCESSING METHOD

(71) Applicant: SUMITOMO CHEMICAL COMPANY, LIMITED, Tokyo (JP)

(72) Inventors: Hajime Fujikura, Hitachi (JP); Taichiro Konno, Hitachi (JP); Takayuki Numata, Hitachi (JP); Shusei Nemoto, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/559,230

(22) PCT Filed: Dec. 22, 2015

(86) PCT No.: PCT/JP2015/085830
§ 371 (c)(1),
(2) Date: Sep. 18, 2017

(87) PCT Pub. No.: WO2016/151968
PCT Pub. Date: Sep. 29, 2016

(65) Prior Publication Data
US 2018/0073139 A1    Mar. 15, 2018

(30) Foreign Application Priority Data
Mar. 25, 2015   (JP) .................. 2015-063489

(51) Int. Cl.
*H05B 3/68*        (2006.01)
*C23C 16/00*       (2006.01)
(Continued)

(52) U.S. Cl.
CPC .......... *C23C 16/458* (2013.01); *C23C 16/303* (2013.01); *C23C 16/34* (2013.01);
(Continued)

(58) Field of Classification Search
CPC ............. H01L 21/0254; H01L 21/0262; H01L 21/02658; H01L 21/02664;
(Continued)

(56) References Cited

U.S. PATENT DOCUMENTS 5,151,871 A  *  9/1992  Matsumura ........ G05D 23/1951
                                                    219/444.1
6,171,641 B1     1/2001  Okamoto et al.
(Continued)

FOREIGN PATENT DOCUMENTS

JP        03-132018 A     6/1991
JP        06-020965 A     1/1994
(Continued)

OTHER PUBLICATIONS

Einglish translation of JP2000-021788, Jan. 2000.*
(Continued)

*Primary Examiner* — Sang Y Paik
(74) *Attorney, Agent, or Firm* — Birch, Stewart, Kolasch & Birch, LLP

(57) ABSTRACT

There is provided a substrate processing apparatus, comprising: a substrate placing table which is provided to at least one of the temperature elevating part and the temperature lowering part formed in a container, and which causes heat-transfer to occur with the substrate placed on a placing surface; and a temperature control part which controls a temperature of the substrate placing table, wherein the temperature control part is configured to: control the temperature of the substrate placing table so that the temperature of the substrate to be loaded into the processing part is elevated to a predetermined temperature, before the substrate is placed on the substrate placing table, when the substrate placing table is provided to the temperature elevating part; and control the temperature of the substrate placing
(Continued)

table so that the temperature of the processed substrate unloaded from the processing part is lowered to a predetermined temperature, before the substrate is placed on the substrate placing table, when the substrate placing table is provided to the temperature lowering part.

8 Claims, 2 Drawing Sheets

(51) Int. Cl.
| | |
|---|---|
| C23C 16/458 | (2006.01) |
| C23C 16/46 | (2006.01) |
| C23C 16/34 | (2006.01) |
| C23C 16/52 | (2006.01) |
| H01L 21/02 | (2006.01) |
| H01L 21/67 | (2006.01) |
| H01L 21/677 | (2006.01) |
| C23C 16/30 | (2006.01) |

(52) U.S. Cl.
CPC .......... *C23C 16/4586* (2013.01); *C23C 16/46* (2013.01); *C23C 16/52* (2013.01); *H01L 21/0254* (2013.01); *H01L 21/0262* (2013.01); *H01L 21/02658* (2013.01); *H01L 21/02664* (2013.01); *H01L 21/6776* (2013.01); *H01L 21/67103* (2013.01); *H01L 21/67109* (2013.01); *H01L 21/67248* (2013.01); *H01L 21/67778* (2013.01)

(58) Field of Classification Search
CPC ............ H01L 21/67103–67115; H01L 21/673; H01L 21/67313; H01L 21/67333; H01L 21/67778; C23C 16/34; C23C 16/458; C23C 16/46; C23C 16/52
USPC ................. 219/443.1–468.2; 118/724, 725
See application file for complete search history.

(56) References Cited

U.S. PATENT DOCUMENTS

| | | | | |
|---|---|---|---|---|
| 6,228,171 | B1* | 5/2001 | Shirakawa | ........ H01L 21/67103 118/58 |
| 2002/0162630 | A1* | 11/2002 | Satoh | .................. C23C 16/4583 156/345.51 |
| 2004/0011780 | A1* | 1/2004 | Sun | ................... H01L 21/67109 219/444.1 |
| 2006/0237431 | A1* | 10/2006 | Quach | ............... H01L 21/67109 219/444.1 |
| 2010/0055318 | A1 | 3/2010 | Volf et al. | |
| 2013/0043442 | A1 | 2/2013 | Konno et al. | |
| 2016/0265112 | A1* | 9/2016 | Tolle | ................. H01L 21/67109 |

FOREIGN PATENT DOCUMENTS

| | | |
|---|---|---|
| JP | 06-275534 A | 9/1994 |
| JP | 11-329983 A | 11/1999 |
| JP | 2000-021788 A | 1/2000 |
| JP | 2004-119519 A | 4/2004 |
| JP | 2005-085849 A | 3/2005 |
| JP | 2005-123284 A | 5/2005 |
| JP | 2007-242729 A | 9/2007 |
| JP | 2010-159463 A | 7/2010 |
| JP | 2013-058741 A | 3/2013 |
| JP | 2014-207465 A | 10/2014 |
| WO | WO 91/09148 A1 | 6/1991 |
| WO | WO 2004/030054 A1 | 4/2004 |

OTHER PUBLICATIONS

International Search Report for PCT/JP2015/085830 (PCT/ISA/210) dated Apr. 5, 2016.
International Preliminary Report on Patentability and English translation of the Written Opinion of the International Searching Authority (Forms PCT/IB/338, PCT/IB/373 and PCT/ISA/237) dated Oct. 5, 2017, for International Application No. PCT/JP2015/085830.
Japanese Notification of Reasons for Refusal (including an English translation thereof) issued in the corresponding Japanese Patent Application No. 2015-063489 dated Aug. 21, 2018.

* cited by examiner

SUBSTRATE PROCESSING APPARATUS AND SUBSTRATE PROCESSING METHOD

TECHNICAL FIELD

The present disclosure relates to a substrate processing apparatus and a substrate processing method.

BACKGROUND

Conventionally, there is provided a substrate processing apparatus including a reaction container having a process chamber formed therein, and configured to process a substrate in the process chamber (for example, see patent document 1).

PRIOR ART DOCUMENT

Patent Document

Patent document 1: Japanese Patent Laid Open Publication No. 2013-58741

SUMMARY

Problem to be Solved by Disclosure

However, in the abovementioned substrate processing apparatus, usually, substrate processing, processing of elevating a temperature of a substrate, and processing of lowering a temperature of a substrate, are performed at a same position in the process chamber (e.g., a position of the process chamber where the substrate processing is performed, i.e., processing position). The substrate processing is performed under a high temperature atmosphere (e.g., 500 degrees C. to 2000 degrees C.) in many cases. Therefore, the time for elevating and lowering a temperature of the substrate is increased, as the temperature of the substrate processing is higher. For example, several tens of minutes to several hours is required for the time for elevating and lowering the temperature of the substrate. As a result, the time from end of a certain substrate processing to start of a subsequent substrate processing is increased, and a productivity of the substrate is reduced in some cases.

In order to solve the abovementioned problem, an object of the present disclosure is to provide a technique of improving the productivity of the substrate.

Means for Solving the Problem

According to an aspect of the present disclosure, there is provided a substrate processing apparatus, including:

a container having therein, a processing part in which a substrate is processed, a temperature elevating part in which a temperature of the substrate to be loaded into the processing part is elevated, and a temperature lowering part in which a temperature of the processed substrate unloaded from the processing part is lowered;

a substrate placing table which is provided to at least one of the temperature elevating part and the temperature lowering part, and which causes heat-transfer to occur with the substrate placed on a placing surface; and a temperature control part which controls a temperature of the substrate placing table, wherein the temperature control part is configured to:
control the temperature of the substrate placing table so that the temperature of the substrate to be loaded into the processing part is elevated to a predetermined temperature, before the substrate is placed on the substrate placing table, when the substrate placing table is provided to the temperature elevating part; and
control the temperature of the substrate placing table so that the temperature of the processed substrate unloaded from the processing part is lowered to a predetermined temperature, before the substrate is placed on the substrate placing table, when the substrate placing table is provided to the temperature lowering part.

According to other aspect of the present disclosure, there is provided a substrate processing method, including:

performing substrate processing in a processing part formed in a container; and performing at least one of:

elevating a temperature of a substrate placed on a placing surface of a substrate placing table which is provided to a temperature elevating part formed in the container, and whose temperature is controlled by a temperature control part so that a temperature of the substrate to be loaded into the processing part is elevated to a predetermined temperature; and lowering a temperature of the substrate placed on a placing surface of a substrate placing table which is provided to a temperature lowering part formed in the container, and whose temperature is controlled by a temperature control part so that a temperature of the processed substrate unloaded from the processing part is lowered to a predetermined temperature.

Advantage of the Disclosure

According to the present disclosure, it is possible to provide a technique of improving the productivity of the substrate.

BRIEF DESCRIPTION OF THE DRAWINGS

FIG. 2 is a schematic view of a placing table included in the substrate processing apparatus according to an embodiment of the present disclosure, and on which a substrate held on a tray is placed, wherein FIG. 2A shows a vertical cross-sectional view thereof, and FIG. 2B shows an upper side view thereof.

DETAILED DESCRIPTION OF THE DISCLOSURE

<An Embodiment of the Present Disclosure>
(1) Configuration of a Substrate Processing Apparatus A substrate processing apparatus according to an embodiment of the present disclosure will be described hereafter, with reference to mainly FIG. 1.

Figure 1:
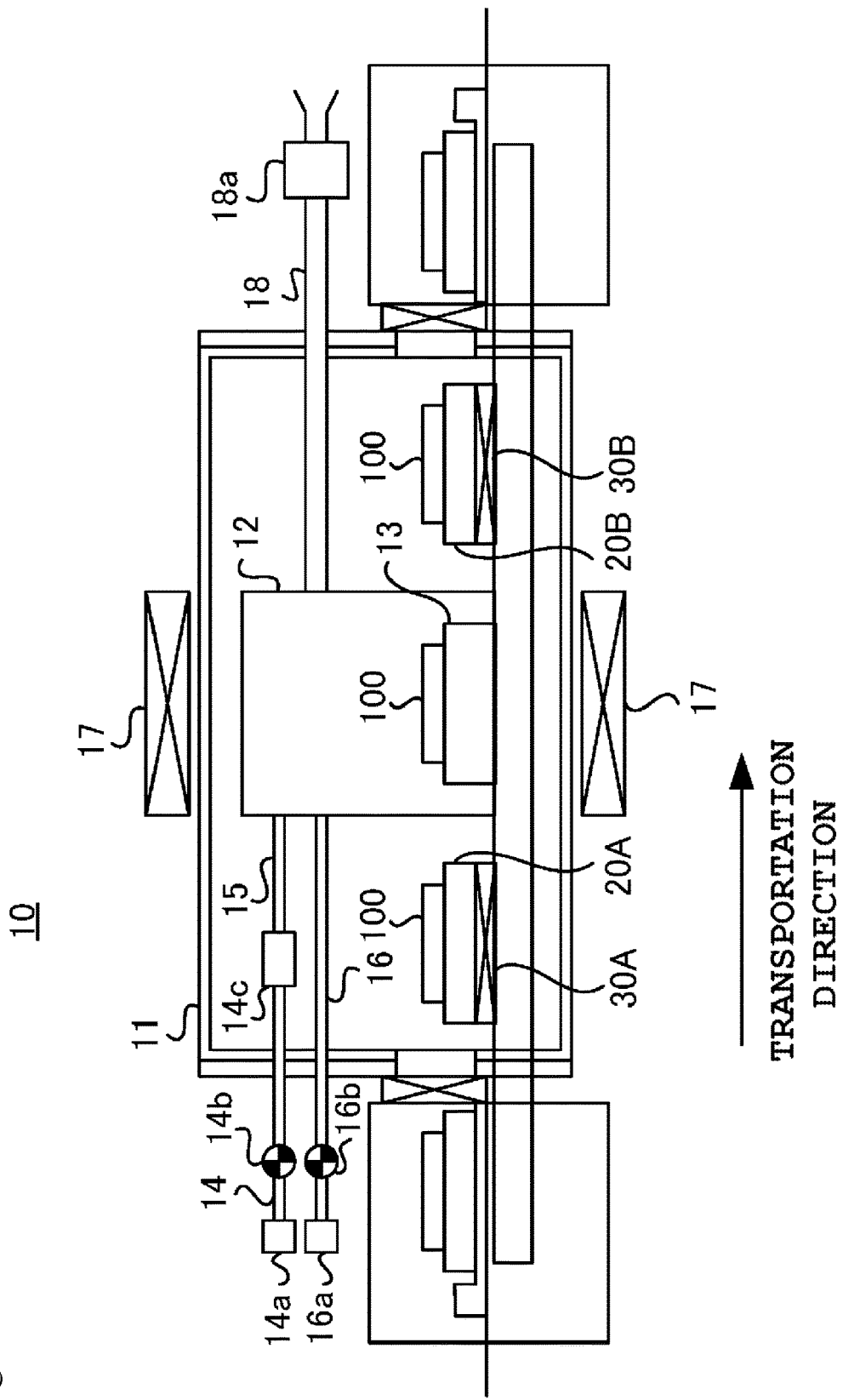
FIG. 1 is a vertical cross-sectional schematic view of a substrate processing apparatus according to an embodiment of the present disclosure.

As shown in FIG. 1, a substrate processing apparatus 10 includes a first container 11 having a hollow part (a hollow cylinder part) therein. The first container 11 is made of a heat-resistant material such as quartz ($SiO_2$), for example. A processing part for performing substrate processing, is provided to an inside of the first container 11, i.e., to an inside of the hollow cylinder part of the first container 11.

A second container 12 for performing substrate processing, is provided in the first container 11. The second container 12 is made of quartz, carbon, or silicon carbide (SiC), for example. A substrate placing table 13 for placing a substrate 100 in a state of being held on a tray 40 described later, is provided to the second container 12. The substrate placing table 13 is preferably made of a material having heat-resistance, corrosion-resistance, etc., such as carbon, quartz, or alumina.

A reaction gas supply pipe 14 is air-tightly provided to the first container 11 so as to penetrate through a side portion of the first container 11. The reaction gas supply pipe 14 is made of a metal material (e.g., stainless-steel) or a nonmetal material (e.g., quartz) having heat-resistance, corrosion-resistance, etc.

A reaction gas supply source 14a, a valve 14b as a valve for supplying/stopping a reaction gas into a processing gas generator 14c, are provided to an outside of the first container 11 on the reaction gas supply pipe 14 in this order from an upstream side. Chlorine ($Cl_2$) gas or hydrogen chloride (HCl) gas for example, is supplied as the reaction gas from the reaction gas supply pipe 14 into the processing gas generator 14c. An upstream end of a first processing gas supply pipe 15 is connected to the processing gas generator 14c. The first processing gas supply pipe 15 is made of a metal material (e.g., stainless-steel) or a nonmetal material (e.g., quartz) having heat-resistance, corrosion-resistance, etc. A downstream end of the first processing gas supply pipe 15 is air-tightly connected to the second container 12. A gas (e.g., a group III element-containing gas such as GaCl gas) generated in the processing gas generator 14c, is supplied as the first processing gas from the first processing gas supply pipe 15 into the second container 12 (specifically, the substrate 100 in the second container 12).

The processing gas generator 14c is provided in the first container 11. The processing gas generator 14c includes a container for having a metal source therein. The container is made of a nonmetal material (e.g., high purity quartz) having heat-resistance and corrosion-resistance. A downstream end of the abovementioned reaction gas supply pipe 14 and an upstream end of the abovementioned first processing gas supply pipe 15, are air-tightly connected to the container. A space through which the reaction gas passes, is formed in an upper part of the metal source in the container. The processing gas generator 14c is configured as follows: the reaction gas and the metal source are reacted with each other due to a contact between the reaction gas and the metal source, when the reaction gas passes through the space, to thereby generate the first processing gas.

For example, a source which is solid at normal temperature, is used as the metal source. Gallium (Ga) solid, indium (In) solid, or aluminum (Al) solid, which is metal source containing a group III element, is used as the metal source, for example. The metal source is in a solid state or in a liquid state in some cases, depending on a temperature in the processing gas generator 14c and a metal to be used.

A first processing gas supply part is mainly composed of the reaction gas supply pipe 14, the valve 14b, the processing gas generator 14c and the first processing gas supply pipe 15. The reaction gas supply source 14a may be included in the first processing gas supply part.

A second processing gas supply pipe 16 is air-tightly provided to the first container 11 so as to penetrate through the side portion of the first container 11. The second processing gas supply pipe 16 is made of a metal material (e.g., stainless-steel) or a nonmetal material (e.g., quartz) having heat-resistance, corrosion-resistance, etc.

A second processing gas supply source 16a, a valve 16b as a valve for supplying/stopping a second processing gas into the second container 12, are provided to the outside of the first container 11 and on the second processing gas supply pipe 16 in this order from an upstream side. A downstream end of the second processing gas supply pipe 16 is air-tightly connected to the second container 12. A group V element-containing gas (e.g., $NH_3$ gas) is supplied as the second processing gas from the second processing gas supply pipe 16 into the second container 12 (specifically, the substrate 100 in the second container 12).

A second processing gas supply part is mainly composed of the second processing gas supply pipe 16 and the valve 16b. The second processing gas supply source 16a may be included in the second processing gas supply part.

On an outer circumference of the first container 11, a heater 17 for heating an inside of the second container 12 (the substrate 100 housed in the second container 12) to a predetermined temperature (e.g., 500 degrees C. to 1200 degrees C.), is provided as a heating part. The heater 17 is formed into a cylindrical shape for example, and provided so as to surround a side wall surface of the first container 11. Specifically, the heater 17 is provided to the outside of the first container 11 so as to surround an outside of the second container 12.

An exhaust pipe 18 for exhausting an atmosphere in the second container 12 is air-tightly provided to the second container 12. The exhaust pipe 18 is air-tightly provided to the second container 12 so as to penetrate through a side wall of the first container 11. A vacuum pump (or a blower) 18a as an exhaust device is provided to the outside of the first container 11 and on the exhaust pipe 18.

The processing part is mainly composed of the second container 12, the first processing gas supply part, the second processing gas supply part, and the heater 17. The exhaust pipe 18 and the vacuum pump 18a may be included in the processing part.

A temperature elevating part for elevating a temperature of the substrate 100 to be loaded into the abovementioned processing part (i.e., into the second container 12) to a predetermined temperature, is formed in the first container 11. The temperature elevating part is formed on an upstream side of the processing part. The temperature elevating part is formed in the first container 11, and formed on an upstream side of the second container 12, for example.

A substrate placing table 20A having a placing surface for placing the substrate 100 thereon, is provided to the temperature elevating part. The substrate placing table 20A is configured to cause heat-transfer (heat-exchange, heat-conduction) to occur with the substrate 100 placed on the placing surface. The substrate placing table 20A is made of a material (e.g., carbon, quartz, or alumina) having heat-resistance, corrosion-resistance, etc.

A temperature control part 30A for controlling a temperature of the substrate placing table 20A, is provided (connected) to the substrate processing apparatus 10. A heating part (heater) for heating the substrate placing table 20A, is used as the temperature control part 30A, for example.

The temperature control part 30A previously controls a temperature of the substrate placing table 20A to a predetermined temperature, before the substrate 100 is placed on the substrate placing table 20A. Namely, the temperature control part 30A controls the temperature of the substrate placing table 20A so that the temperature of the substrate 100 to be loaded into the processing part is elevated to a predetermined temperature, before the substrate 100 is placed on the substrate placing table 20A. For example, the temperature control part 30A controls the temperature of the substrate placing table 20A so that a rate of elevating the temperature of the substrate 100 is more increased than a case of controlling the temperature of the substrate placing table 20A to a predetermined temperature after the substrate 100 is placed thereon.

Preferably, the temperature control part 30A previously controls the temperature of the substrate placing table 20A so that the temperature of the substrate 100 can be elevated to a temperature at which substrate processing can be started to the substrate 100 immediately after the substrate 100 is loaded into the second container 12. More preferably, the temperature control part 30A previously controls the temperature of the substrate placing table 20A, to almost same as a temperature for processing the substrate 100 (processing temperature) in the processing part (e.g., 500 degrees C. to 1200 degrees C.), for example.

The substrate 100 is placed on the substrate placing table 20A whose temperature is previously controlled by the temperature control part 30A to a predetermined temperature (i.e., the substrate placing table 20A which is previously heated to a predetermined temperature), so that the temperature of the substrate 100 can be rapidly elevated. Namely, the substrate 100 can be rapidly heated. For example, the temperature of the substrate 100 at about room temperature loaded into the first container 11, can be rapidly elevated to almost same as the processing temperature of the substrate 100 (e.g., 500 degrees C. to 1200 degrees C.).

The temperature elevating part is mainly composed of the substrate placing table 20A and the temperature control part 30A.

A temperature lowering part for lowering a temperature of the processed substrate 100 unloaded from the abovementioned processing part (i.e., from the second container 12) to a predetermined temperature, is formed in the first container 11. The temperature lowering part is formed on a downstream side of the processing part. The temperature lowering part is formed in the first container 11, and formed on a downstream side of the second container 12, for example.

A substrate placing table 20B having a placing surface for placing the substrate 100 thereon, is provided to the temperature lowering part. The substrate placing table 20B is configured to cause heat-transfer (heat-exchange, heat-conduction) to occur with the substrate 100 placed on the placing surface. The substrate placing table 20B is made of a material (e.g., carbon, quartz, or alumina) having heat-resistance, corrosion-resistance, etc.

A temperature control part 30B for controlling a temperature of the substrate placing table 20B, is provided (connected) to the substrate processing apparatus 10. A cooling part (a heat radiation board) for cooling the substrate placing table 20B, is used as the temperature control part 30B, for example.

The temperature control part 30B previously controls a temperature of the substrate placing table 20B to a predetermined temperature, before the substrate 100 is placed on the substrate placing table 20B. Namely, the temperature control part 30B controls the temperature of the substrate placing table 20B so that the temperature of the processed substrate 100 unloaded from the processing part is lowered to a predetermined temperature, before the substrate 100 is placed on the substrate placing table 20B. For example, the temperature control part 30B controls the temperature of the substrate placing table 20B so that the time for lowering the temperature of the substrate 100 is more decreased than a case of controlling the temperature of the substrate placing table 20B to a predetermined temperature after the substrate 100 is placed thereon.

Preferably, the temperature control part 30B previously controls the temperature of the substrate placing table 20B so that the temperature of the substrate 100 can be lowered to a temperature at which the substrate 100 can be unloaded from the first container 11. For example, the temperature control part 30B preferably controls the temperature of the substrate placing table 20B, to a temperature lower than a temperature for processing the substrate 100 in the processing part (e.g., 100 degrees C. or less, preferably about a room temperature).

The substrate 100 is placed on the substrate placing table 20B whose temperature is previously controlled by the temperature control part 30B to a predetermined temperature (i.e., the substrate placing table 20B which is previously controlled tea predetermined temperature), so that the temperature of the substrate 100 can be rapidly lowered. Namely, the substrate 100 can be rapidly cooled. For example, the temperature of the substrate 100 unloaded from the second container 12 and heated to the processing temperature, can be rapidly lowered to a temperature at which the substrate 100 can be unloaded from the first container 11 (e.g., about room temperature).

The temperature lowering part is mainly composed of the substrate placing table 20B and the temperature control part 30B.

Figure 2:
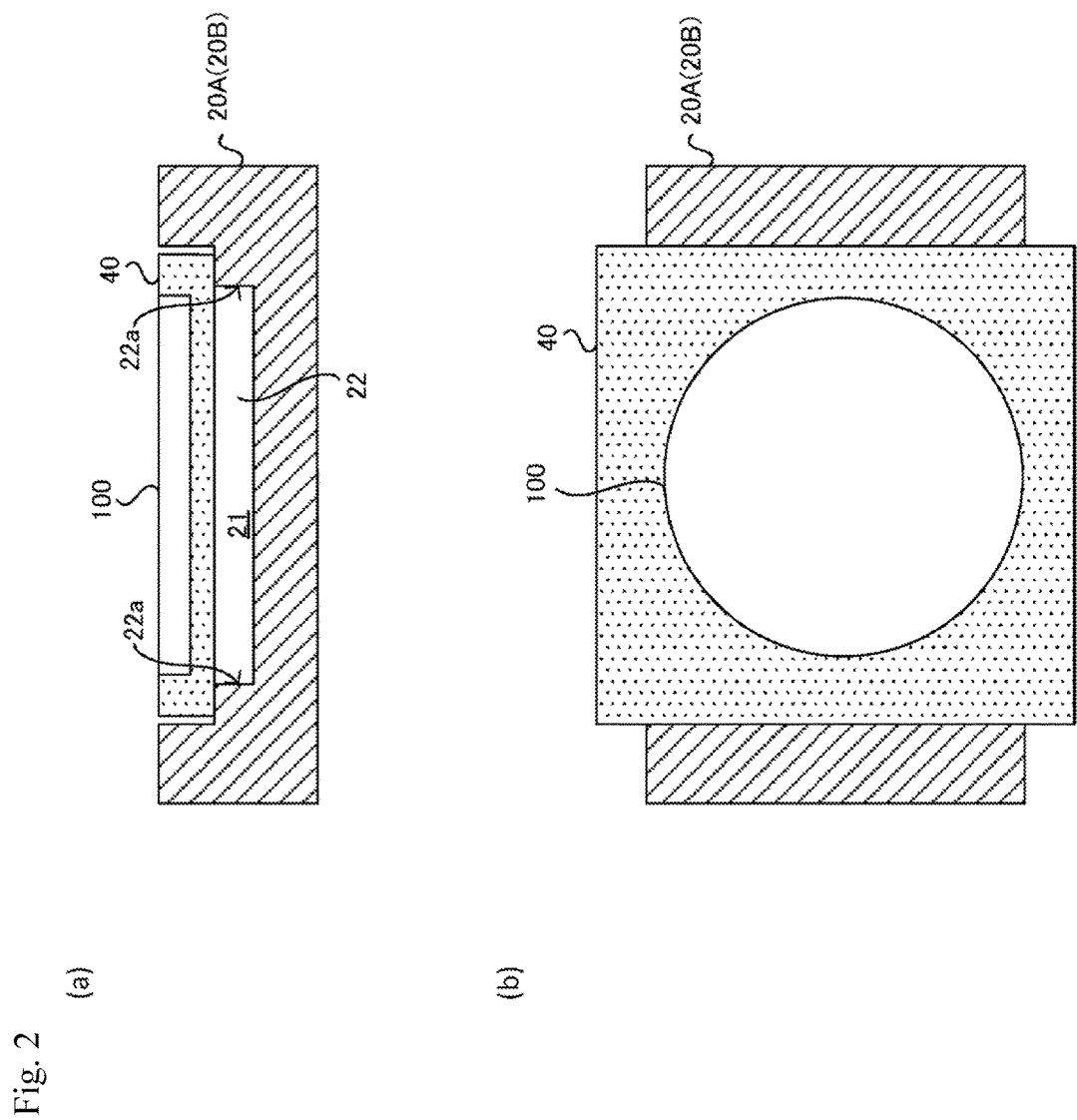

As shown in FIG. 2, a recess 22 is formed on the placing surface of the substrate 100 of the substrate placing tables 20A and 20B respectively so that a gap 21 is formed between the substrate 100 and the substrate placing table 20A (20B), when the substrate 100 is placed on the substrate placing table 20A (20B). Thereby, heat-transfer occurs due to radiation heat between the substrate placing table 20A (20B) and the substrate 100. For example, in the substrate placing table 20A provided to the temperature elevating part, heat-transfer occurs due to radiation heat radiated from the substrate placing table 20A into the gap 21 between the substrate placing table 20A and the substrate 100.

The substrate 100 is preferably placed on the placing surface of the substrate placing table 20A (20B) in a state of being held on a tray (substrate holding member) 40. In this case, the gap 21 is formed between the substrate placing table 20A (20B) and the tray 40.

The tray 40 is configured to hold the substrate 100 while placing the substrate 100 thereon. A round-shaped recess whose diameter is slightly larger than a diameter of the substrate 100 for example, is formed at a placing position of the substrate 100 on the surface of the tray 40, in order to easily perform positioning of the substrate 100, and suppress positioning error of the substrate 100 caused by transferring the tray 40. The tray 40 is made of a material having heat-resistance, corrosion-resistance, etc., such as carbon, quartz, or alumina.

The recess 22 is configured for example so that the substrate 100 can be housed therein. For example, the recess 22 is configured to house the tray 40 therein, so that the substrate 100 is also housed in the recess 22. The recess 22 is configured so that an upper surface of the substrate placing table 20A (20B) is flash with a processing surface of the substrate 100, when the substrate 100 is housed in the recess 22.

Further, a projection 22a for supporting a peripheral portion of a rear surface of the tray 40, is formed in the recess 22. The projection 22a is preferably formed so that a contact area with the tray 40 is minimized, in order to reduce a direct transfer of heat from the projection 22a to the tray 40 (a transfer of heat not through the gap 21) due to a contact between the projection 22a and the tray 40.

A height of the projection 22a is preferably 0.1 mm or more to 2 mm or less, and more preferably 1 mm, for example. The height of the projection 22a is a height from a bottom surface of the recess 22 to an upper surface of the projection 22a.

When the height of the projection 22a is less than 0.1 mm, a volume of the gap 21 is excessively decreased, and heat-transfer does not occur in some cases due to radiation heat between the substrate placing table 20A (20B) and the substrate 100. For example, direct transfer of heat occurs in some cases between the substrate placing table 20A (20B) and the substrate 100. By setting the height of the projection 22a to 0.1 mm or more, the volume of the gap 21 can be sufficiently secured. As a result, heat-transfer can surely occur due to radiation heat between the substrate placing table 20A (20B) and the substrate 100.

However, when the height of the projection 22a exceeds 2 mm, the volume of the gap 21 is excessively increased, and efficiency of heat-transfer which occurs due to radiation heat between the substrate placing table 20A (20B) and the substrate 100, is reduced in some cases. By setting the height of the projection 22a to 2 mm or less, excessive increase of the volume of the gap 21 can be suppressed. As a result, reduction of efficiency of heat-transfer which occurs due to radiation heat between the substrate placing table 20A (20B) and the substrate 100, can be suppressed.

By setting the height of the projection 22a to 1 mm, reduction of efficiency of heat-transfer can be surely suppressed while causing heat-transfer to occur due to radiation heat between the substrate placing table 20A (20B) and the substrate 100.

Further, the projection 22a is preferably configured so that a diameter of the gap 21 in a horizontal direction is longer than a diameter of the substrate 100. Namely, the projection 22a is preferably configured not to be positioned on a rear surface of the substrate 100 via the tray 40.

A degassing part 23 for degassing of the recess 22, is provided to the substrate placing table 20A (20B), when the substrate 100 is placed on the placing surface of the substrate placing table 20A (20B). For example, the substrate placing table 20A (20B) is configured to prevent an inside of the gap 21 from being sealed, when the substrate 100 held on the tray 40 is placed on the projection 22a. The degassing part 23 is configured so that a through hole is formed penetrating through the substrate placing table 20A (20B) from the bottom surface of the recess 22 toward a bottom surface of the substrate placing table 20A (20B), or a through hole is formed penetrating through the substrate placing table 20A (20B) from a side surface of the recess 22 toward a side surface of the substrate placing table 20A (20B), for example. Further, the degassing part 23 may be configured so that the recess 22 itself is formed as a through hole, for example.

(2) Substrate Processing Step

Next, explanation is given for a substrate processing step performed as one of the semiconductor manufacturing steps according to this embodiment. This step is performed by the abovementioned substrate processing apparatus 10. Here, explanation is given for a case of forming a GaN film on the substrate 100, as an example of substrate processing.

(Temperature Regulating Step)

First, Ga solid for example, is put (replenished) in the container provided in the processing gas generator 14c. Then, the inside of the second container 12 is heated by the heater 17 so that the temperature in the second container 12 reaches a predetermined temperature (e.g., 500 degrees C. to 1200 degrees C.). Further, the inside of the second container 12 is heated by the heater 17, thereby the inside of the first container 11 is heated and the inside of the container provided in the processing gas generator 14c is heated. As a result, the Ga solid in the container is melted, to thereby generate a Ga melt as the metal source.

Further, a temperature of the substrate placing table 20A provided to the temperature elevating part in the first container 11, is controlled by the temperature control part 30A so that a temperature of the substrate 100 to be loaded into the processing part (into the second container 12) is elevated to a predetermined temperature (e.g., the processing temperature of a substrate (specifically, 500 degrees C. to 1200 degrees C.)). Further, a temperature of the substrate placing table 20B provided to the temperature elevating part in the first container 11, is controlled by the temperature control part 30B so that the temperature of the processed substrate 100 unloaded from the processing part (from the second container 12) is lowered to a predetermined temperature (e.g., about room temperature).

(Temperature Elevating Step/Pressure Regulating Step)

After the temperature of the substrate placing table 20A reaches a predetermined temperature, a sapphire substrate for example as the substrate 100 is moved to the temperature elevating part. Specifically, the substrate 100 is loaded into the first container 11 in a state of being held on the tray 40, and the tray 40 that holds the substrate 100 is placed on the placing surface of the substrate placing table 20A whose temperature is previously controlled by the temperature control part 30A to a predetermined temperature. Thereby, heat-transfer occurs due to radiation heat for example between the substrate placing table 20A and the substrate 100, immediately after the substrate 100 is placed on the substrate placing table 20A. Accordingly, the temperature of the substrate 100 is rapidly elevated.

After the substrate 100 is placed on the substrate placing table 20A, the first container 11 is air-tightly maintained. Then, in order to reduce impurities in the second container 12 and the first container 11, the atmosphere of the second container 12 and the atmosphere of the first container 11 via the second container 12, are vacuum-exhausted by the vacuum pump 18a. Thereafter, an inert gas (e.g., nitrogen ($N_2$) gas) is charged into the second container 12, and at least a pressure in the second container 12 is set to an atmospheric pressure (pressure regulating step). For this purpose, it is acceptable that $N_2$ gas is supplied into the second container 12 for a certain period of the time without using the vacuum pump 18a, and thereafter the pressure in the second container 12 is set to a predetermined pressure (typically 0.1 to 1 atm.) using the vacuum pump (or a blower) 18a. The pressure regulating is preferably performed simultaneously and in parallel with the abovementioned processing of elevating the temperature of the substrate 100.

(Film Forming Step)

The substrate 100 is moved to the processing part from the temperature elevating part, when the temperature of the substrate 100 placed on the substrate placing table 20A reaches a predetermined temperature (e.g., a temperature at which the substrate processing can be started immediately after the substrate 100 is loaded into the second container 12). Specifically, the substrate 100 whose temperature is elevated to a predetermined temperature, is loaded into the second container 12 and placed on the substrate placing table 13, in a state of being held on the tray 40. Then, the valve 16b is opened, and supply of the second processing gas (e.g., $NH_3$ gas) from the second processing gas supply pipe 16 into the second container 12 is started, when the Ga melt is generated in the container provided in the processing gas generator 14c and the temperature in the second container 12 (the temperature of the substrate 100 in the second container 12) reaches a predetermined temperature.

Thereafter, the valve 14b is opened, and supply of the reaction gas (e.g., HCl gas) from the reaction gas supply pipe 14 into the processing gas generator 14c (into the container provided in the processing gas generator 14c), is started. Consequently, the Ga melt and the reaction gas are reacted with each other in the processing gas generator 14c, to thereby start generating of the first processing gas (e.g., GaCl gas). Then, the first processing gas generated in the processing gas generator 14c is supplied from the first processing gas supply pipe 15 into the second container 12.

Then, the first processing gas and the second processing gas are reacted with each other in the second container 12, to thereby form a GaN film having a predetermined thickness on the substrate 100.

(Temperature Lowering Step/Pressure Regulating Step)

After a predetermined substrate processing time (a predetermined film formation time) is elapsed and the thickness of the GaN film becomes a predetermined thickness, supply of the reaction gas into the processing gas generator 14c and supply of the second processing gas into the second container 12, are stopped.

Then, the processed substrate 100 is moved to the temperature lowering part from the processing part. Specifically, the processed substrate 100 is unloaded from the second container 12 in a state of being held on the tray 40, and the tray 40 that holds the substrate 100 is placed on the substrate placing table 20B whose temperature is previously controlled by the temperature control part 30B to a predetermined temperature. Thereby, heat-transfer occurs due to radiation heat for example between the substrate placing table 20B and the substrate 100, immediately after the substrate 100 is placed on the substrate placing table 20B. Accordingly, the temperature of the substrate 100 is rapidly lowered.

Further, after the reaction gas, the first processing gas, and the second processing gas, which are remained in the second container 12 and the first container 11, are exhausted by the vacuum pump 18a, $N_2$ gas for example is supplied into the second container 12. Thereby, the inside of the second container 12 and the inside of the first container 11 via the second container 12 are returned to an atmospheric pressure. This processing of regulating the pressure is preferably performed simultaneously and in parallel with the above-mentioned processing of lowering the temperature of the substrate 100.

(Substrate Unloading Step)

When the temperature of the substrate 100 placed on the substrate placing table 20B is lowered to a predetermined temperature (e.g., a temperature at which the substrate 100 can be unloaded from the first container 11 (specifically, about room temperature)), the tray 40 that holds the substrate 100 is unloaded from the substrate placing table 20B to the outside of the first container 11. Thereby, the substrate processing step is ended.

Preferably, when the abovementioned substrate processing step is performed, the temperature elevating step, the film forming step, and the temperature lowering step are performed simultaneously and in parallel with each other by the substrate processing apparatus 10. Namely, the temperature of the substrate 100 to be subsequently loaded into the second container 12 is elevated in the temperature elevating part, and the temperature of the processed substrate 100 is lowered in the temperature lowering part, while processing a certain substrate 100 in the second container 12.

(3) Effect of this Embodiment

According to this embodiment, the following one or a plurality of effects are exhibited.

(a) The substrate placing table 20A for causing heat-transfer to occur with the substrate 100 placed on the placing surface thereof, is provided to the temperature elevating part in the first container 11, and the substrate 100 is placed on the substrate placing table 20A whose temperature is previously controlled by the temperature control part 30A to a predetermined temperature. Accordingly, the temperature of the substrate 100 can be rapidly elevated. Namely, the time for elevating the temperature of the substrate 100 can be reduced. As a result, the time from end of a certain substrate processing to start of a subsequent substrate processing can be reduced, and therefore the productivity of the substrate 100 can be improved.

(b) The substrate placing table 20B for causing heat-transfer to occur with the substrate 100 placed on the placing surface thereof, is provided to the temperature lowering part in the first container 11, and the substrate 100 is placed on the substrate placing table 20B whose temperature is previously controlled by the temperature control part 30B to a predetermined temperature. Accordingly, the temperature of the substrate 100 can be rapidly lowered. Namely, the time for lowering the temperature of the substrate 100 can be reduced. As a result, the time from end of a certain substrate processing to start of a subsequent substrate processing can be reduced, and therefore the productivity of the substrate 100 can be improved.

(c) The substrate placing tables 20A, 20B are configured respectively so that the gap 21 is formed between the substrate 100 and the substrate placing tables 20A, 20B, when the substrate 100 is placed thereon. Accordingly, heat-transfer can occur due to radiation heat between the substrate placing tables 20A, 20B and the substrate 100. Thereby, in-plane uniform heat-transfer can occur between the substrate 100 and the substrate placing tables 20A, 20B. For example, the temperature of the substrate 100 can be elevated and lowered uniformly in-plane. As a result, generation of cracks, etc., of the substrate 100 can be reduced. Namely, the productivity of the substrate 100 can be further improved.

For example, it is difficult to perform flat processing of flattening the surface of member made of quartz, etc., such as the substrate placing table 20A (20B) or the tray 40. Therefore, fine irregularities are formed on the surface of the tray 40 or the substrate placing table 20A (20B) in some cases, for example, when the tray 40 is formed, or when processing of forming the recess 22 on the substrate placing table 20A (20B) is performed. Further, the fine irregularities due to an aged deterioration resulting from use, etc., are formed in some cases on the surfaces of the tray 40 or the substrate placing table 20A (20B). Accordingly, when heat-transfer is intended to occur by making the entire rear surface of the tray 40 brought into contact with the substrate placing table 20A (20B), heat-transfer occurs locally in some cases due to the irregularities formed on the tray 40 or the substrate placing table 20A (20B). Namely, the temperature of the substrate 100 is not elevated and lowered uniformly in-plane in some cases. In contrast, heat-transfer occurs due to radiation heat between the substrate placing table 20A, 20B and the substrate 100. As a result, heat-transfer can occur uniformly in-plane between the substrate 100 and the substrate placing table 20A, 20B, even in a case that the fine irregularities are formed on the surface of the substrate placing table 20A (20B) or the tray 40.

(d) By setting the diameter of the gap 21 longer than the diameter of the substrate 100, heat-transfer can occur more uniformly in-plane between the substrate 100 and the substrate placing tables 20A, 20B. Therefore, the above effect of (c) can be further obtained.

(e) The temperature elevating part, the processing part, and the temperature lowering part are respectively formed in the first container 11, thereby it is not necessary to lower the temperature of the second container 12 to a predetermined temperature after the substrate processing is ended in the processing part. Namely, the temperature of the inside of the second container 12 can be maintained at the processing temperature. As a result, the time from end of a certain substrate processing to start of a subsequent substrate processing can be more reduced, and the productivity of the substrate 100 can be more improved.

(f) Further, processing of elevating the temperature of the substrate 100 in the temperature elevating part, substrate processing performed to the substrate 100 in the processing part, and processing of lowering the temperature of the substrate 100 in the temperature lowering part, are performed simultaneously and in parallel. Accordingly, the productivity of the substrate 100 can be more improved.

(g) The degassing part 23 is provided to the substrate placing table 20A (20B). Accordingly, the substrate 100 is prevented from lifting, or the substrate placing table 20A (20B) or the tray 40, etc., is prevented from breaking, etc., even in a case that a gas that exists in the gap 21 is heated and expanded due to radiation heat.

<Other Embodiment>

As described above, an embodiment of the present disclosure has been specifically described. However, the present disclosure is not limited to the abovementioned embodiments, and various modifications can be made without departing from the gist of the disclosure.

In the abovementioned embodiment, an explanation has given for a case that the substrate placing tables 20A, 20B for causing heat-transfer to occur with the substrate 100, are respectively provided to the temperature elevating part and the temperature lowering part. However, the present disclosure is not limited thereto. Namely, the substrate placing table 20A (20B) for causing heat-transfer to occur with the substrate 100, may be provided to at least one of the temperature elevating part and the temperature lowering part. Even in this case, the productivity of the substrate 100 can be more improved than a case of controlling the temperature of the substrate placing table 20A (20B) to a predetermined temperature, after the substrate 100 is placed thereon, for example. Namely, the above effect of (a) or (b) can be obtained.

In the abovementioned embodiment, an explanation has given for a case that the substrate 100 is placed on the substrate placing table 20A (20B) in a state of being held on the tray 40. However, the present disclosure is not limited thereto. For example, the substrate 100 may be directly placed on the placing surface of the substrate placing table 20A (20B). In this case, the gap 21 is formed between the substrate placing table 20A (20B) and the substrate 100. In addition, the projection 22a is preferably formed so as to support the peripheral portion of the rear surface of the substrate 100.

Further, for example, the tray 40 may be configured to form the gap 21 between the tray 40 and the substrate 100, when the substrate 100 is placed on the tray 40. Namely, the tray 40 may be configured so that heat-transfer occurs due to radiation heat between the tray 40 and the substrate 100.

In the abovementioned embodiment, an explanation has given for a case that the substrate placing table 20A is heated to a predetermined temperature by the heater as the temperature control part 30A. However, the present disclosure is not limited thereto. For example, the temperature of the substrate placing table 20A may be controlled to a predetermined temperature by using the cooling part (a cooler, the heat radiation board) as the temperature control part 30A.

In the abovementioned embodiment, an explanation has given for a case that one substrate 100 is placed on the substrate placing table 20A (20B). However, the present disclosure is not limited thereto. Namely, the substrate placing table 20A (20B) may be configured to place a plurality of substrates 100 thereon. For example, the substrate placing table 20A (20B) may be configured to place a plurality of substrates 100 on the placing surface thereof so as to be arranged on the same surface and on the same circumference. The term of "on the same surface" does not always mean a completely same surface, but means that a plurality of substrates 100 are arranged so as not to be overlapped with each other when the substrate placing table 20A (20B) is viewed from an upper side. Even in this case, the above effects of (a) to (c), etc., can be obtained.

In the abovementioned embodiment, an explanation has given for the substrate processing apparatus 10 including the processing gas generator 14c. However, the present disclosure is not limited thereto. A substrate processing apparatus is not always required to include the processing gas generator 14c. Even in this case, the above effects of (a) to (c), etc., can be obtained.

In the abovementioned embodiment, an explanation has given for a case that the Ga melt obtained by melting Ga solid at a high temperature for example, is used as the metal source. However, the present disclosure is not limited thereto. A source which is liquid at normal temperature, may be used as the metal source.

In the abovementioned embodiment, an explanation has given for a case that the processing gas generator 14c is provided to the first container 11. However, the present disclosure is not limited thereto. For example, the processing gas generator 14c may be provided to the outside of the first container 11. In this case, a heater for heating the inside of the container provided to the processing gas generator 14c to a predetermined temperature, may be provided on the outer circumference of the processing gas generator 14c.

In the abovementioned embodiment, an explanation has given for a case that the substrate processing apparatus is a HVPE apparatus. However, the present disclosure is not limited thereto. For example, the substrate processing apparatus may be a MOVPE apparatus.

Further, in the abovementioned embodiment, an explanation has given for the processing of forming the GaN film as the substrate processing. However, the present disclosure is not limited thereto. For example, the present disclosure can also be applied to a substrate processing apparatus that performs film formation processing of forming various films such as an oxide film or a metal film, or performs etching treatment, as the substrate processing, or the substrate processing apparatus that manufactures a substrate by performing the abovementioned substrate processing.

<Preferable Aspects of the Present Disclosure>

Preferable aspects of the present disclosure will be supplementarily described hereafter.

[Supplementary Description 1]

According to an aspect of the present disclosure, there is provided a substrate processing apparatus, including:

a container having therein, a processing part in which a substrate is processed, a temperature elevating part in which a temperature of the substrate to be loaded into the processing part is elevated, and a temperature lowering part in which a temperature of the processed substrate unloaded from the processing part is lowered;

a substrate placing table which is provided to at least one of the temperature elevating part and the temperature lowering part, and which causes heat-transfer to occur with the substrate placed on a placing surface; and a temperature control part which controls a temperature of the substrate placing table, wherein the temperature control part is configured to:

control the temperature of the substrate placing table so that the temperature of the substrate to be loaded into the processing part is elevated to a predetermined temperature, before the substrate is placed on the substrate placing table, when the substrate placing table is provided to the temperature elevating part; and control the temperature of the substrate placing table so that the temperature of the processed substrate unloaded from the processing part is lowered to a predetermined temperature, before the substrate is placed on the substrate placing table, when the substrate placing table is provided to the temperature lowering part.

[Supplementary Description 2]

Preferably, there is provided the substrate processing apparatus of the supplementary description 1, wherein the temperature control part controls the temperature of the substrate placing table provided to the temperature elevating part so that a rate of elevating the temperature of the substrate is more increased than a case of controlling the temperature of the substrate placing table after the substrate is placed thereon.

[Supplementary Description 3]

Preferably, there is provided the substrate processing apparatus of the supplementary description 1 or 2, wherein the temperature control part previously controls the temperature of the substrate placing table provided to the temperature elevating part, to almost same as a temperature for processing the substrate in the processing part.

[Supplementary Description 4]

Preferably, there is provided the substrate processing apparatus of any one of the supplementary descriptions 1 to 3, wherein the temperature control part controls the temperature of the substrate placing table provided to the temperature lowering part so that a rate of lowering the temperature of the substrate is more increased than a case of controlling the temperature of the substrate placing table after the substrate is placed thereon.

[Supplementary Description 5]

Preferably, there is provided the substrate processing apparatus of any one of the supplementary descriptions 1 to 4, wherein the temperature control part previously controls the temperature of the substrate placing table provided to the temperature lowering part, to a temperature lower than a temperature for processing the substrate in the processing part.

[Supplementary Description 6]

Preferably, there is provided the substrate processing apparatus of any one of the supplementary descriptions 1 to 5, wherein a recess is formed on the placing surface of the substrate placing table so that a gap is formed between the substrate and the substrate placing table, when the substrate is placed on the substrate placing table, and heat-transfer occurs due to radiation heat between the substrate placing table and the substrate.

[Supplementary Description 7]

Preferably, there is provided the substrate processing apparatus of the supplementary description 6, wherein a projection is formed in the recess to support a peripheral portion of a rear surface of the substrate.

[Supplementary Description 8]

Preferably, there is provided the substrate processing apparatus of the supplementary description 6, wherein the substrate is placed on the substrate placing table in a state of being held on a tray that holds a substrate, the gap is formed between the substrate placing table and the tray, and a projection is formed in the recess to support a peripheral portion of a rear surface of the tray.

[Supplementary Description 9]

Preferably, there is provided the substrate processing apparatus of the supplementary description 7 or 8, wherein a height of the projection is 0.1 mm or more and 2 mm or less.

[Supplementary Description 10]

Preferably, there is provided the substrate processing apparatus of the supplementary description 8 or 9, wherein a diameter of the gap is longer than a diameter of the substrate.

[Supplementary Description 11]

Preferably, there is provided the substrate processing apparatus of any one of the supplementary descriptions 1 to 10, wherein a degassing part is provided to the substrate placing table for degassing in the gap, when the substrate is placed on the placing surface.

[Supplementary Description 12]

According to other aspect of the present disclosure, there is provided a substrate processing method, including:

performing substrate processing in a processing part formed in a container; and performing at least one of:

elevating a temperature of a substrate placed on a placing surface of a substrate placing table which is provided to a temperature elevating part formed in the container, and whose temperature is controlled by a temperature control part so that a temperature of the substrate to be loaded into the processing part is elevated to a predetermined temperature; and lowering a temperature of the substrate placed on a placing surface of a substrate placing table which is provided to a temperature lowering part formed in the container, and whose temperature is controlled by a temperature control part so that a temperature of the processed substrate unloaded from the processing part is lowered to a predetermined temperature.

DESCRIPTION OF SIGNS AND NUMERALS

10 Substrate processing apparatus
11 First container (container)
20A, 20B Substrate placing table
30A, 30B Temperature control part
100 Substrate

The invention claimed is:

1. A substrate processing apparatus, comprising:

a container having therein, a processing part in which a substrate is processed, a temperature elevating part in which a temperature of the substrate to be loaded into the processing part is elevated, and a temperature lowering part in which a temperature of the processed substrate unloaded from the processing part is lowered;

a substrate placing table which is provided to at least one of the temperature elevating part and the temperature lowering part, and which causes heat-transfer to occur with the substrate placed on a placing surface; and a temperature control part which controls a temperature of the substrate placing table, wherein the processing part and at least one of the temperature elevating part and the temperature lowering part are provided at different positions in the container, wherein the temperature control part is configured to:

control the temperature of the substrate placing table so that the temperature of the substrate to be loaded into the processing part is elevated to a predetermined temperature, before the substrate is placed on the substrate placing table, when the substrate placing table is provided to the temperature elevating part; and control the temperature of the substrate placing table so that the temperature of the processed substrate unloaded from the processing part is lowered to a predetermined temperature, before the substrate is placed on the substrate placing table, when the substrate placing table is provided to the temperature lowering part; and wherein the processing part has a processing container provided in the container, and a heating part for heating an inside of the processing container, and the heating part is controlled so that a temperature in the processing container is maintained at a processing temperature even after a predetermined processing of the substrate is ended.

2. The substrate processing apparatus according to claim 1, wherein a recess is formed on the placing surface of the substrate placing table so that a gap is formed between the substrate and the substrate placing table, when the substrate is placed on the substrate placing table, and heat-transfer occurs due to radiation heat between the substrate placing table and the substrate.

3. The substrate processing apparatus according to claim 2, wherein a projection is formed in the recess to support a peripheral portion of a rear surface of the substrate.

4. The substrate processing apparatus according to claim 2, wherein the substrate is placed on the substrate placing table in a state of being held on a tray that holds a substrate, the gap is formed between the substrate placing table and the tray, and a projection is formed in the recess to support a peripheral portion of a rear surface of the tray.

5. The substrate processing apparatus according to claim 4, wherein a diameter of the gap is longer than a diameter of the substrate.

6. The substrate processing apparatus according to claim 1, wherein the processing part, the temperature elevating part, and the temperature lowering part are provided at different positions in the container, respectively.

7. The substrate processing apparatus according to claim 6, wherein the temperature elevating part and the temperature lowering part individually have the temperature control part, respectively.

8. The substrate processing apparatus according to claim 1, wherein in the temperature elevating part, the temperature of the substrate to be loaded into the processing part is elevated to a processing temperature at which the substrate is processed in the processing part.

* * * * *